(12) United States Patent
Keßler et al.

(10) Patent No.: US 11,375,633 B2
(45) Date of Patent: Jun. 28, 2022

(54) ELECTRONIC DEVICE

(71) Applicant: Endress+Hauser SE+Co. KG, Maulburg (DE)

(72) Inventors: Simon Keßler, Steinen (DE); Jürgen Streule, Rheinfelden (DE); Raphael Singh, Wehr (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 24 days.

(21) Appl. No.: 16/980,804

(22) PCT Filed: Feb. 15, 2019

(86) PCT No.: PCT/EP2019/053846
§ 371 (c)(1),
(2) Date: Sep. 14, 2020

(87) PCT Pub. No.: WO2019/174857
PCT Pub. Date: Sep. 19, 2019

(65) Prior Publication Data
US 2021/0084785 A1    Mar. 18, 2021

(30) Foreign Application Priority Data
Mar. 13, 2018  (DE) .................... 20 2018 101 401.3

(51) Int. Cl.
*H05K 5/06* (2006.01)
*H01L 21/02* (2006.01)

(52) U.S. Cl.
CPC ....... *H05K 5/064* (2013.01); *H01L 21/02214* (2013.01)

(58) Field of Classification Search
CPC ..... H05K 5/064; H05K 5/06; H01L 21/02214
See application file for complete search history.

(56) References Cited

U.S. PATENT DOCUMENTS 5,057,348 A * 10/1991 Drain .................... C08F 283/10
428/209
2020/0411912 A1 * 12/2020 Akens ............... H01M 10/4257

FOREIGN PATENT DOCUMENTS

DE          19901913 A1    7/2000
DE      102009016762 B4   10/2010
(Continued)

*Primary Examiner* — Mohammed Shamsuzzaman
(74) *Attorney, Agent, or Firm* — Kelly J. Smith; Endress+Hauser (USA) Holding, Inc.

(57) ABSTRACT

The disclosure relates to an electronic device including a housing filled to a fill level with a first matrix produced from a first potting compound, and a circuit board having a component arranged thereon and having a passageway that connects a component side arranged within the housing interior filled with the first matrix and a front face of the component arranged outside the housing interior filled with the first matrix, the passageway acts as capillaries for media whose viscosity is less than a limit and as barriers for media whose viscosity is greater than the limit, the component is arranged in a spatially bounded region adjoining the component side, a second matrix produced from a second potting compound having a viscosity exceeding the limit, which second matrix effects a terminal sealing of the connection formed by the passageway against the first potting compound used for producing the first matrix.

9 Claims, 2 Drawing Sheets

(56) References Cited

FOREIGN PATENT DOCUMENTS

| | | | |
|---|---|---|---|
| DE | 102009026260 A1 | 2/2011 | |
| DE | 102014007443 A1 | 11/2015 | |
| DE | 102016100479 A1 | 7/2017 | |
| WO | WO-2008116539 A2 * | 10/2008 | ......... H05K 7/20463 |
| WO | WO-2014146614 A1 * | 9/2014 | ............ H02M 7/003 |
| WO | WO-2017089031 A1 * | 6/2017 | ............. H05K 1/144 |

* cited by examiner

ELECTRONIC DEVICE

CROSS-REFERENCE TO RELATED APPLICATIONS

The present application is related to and claims the priority benefit of German Patent Application No. 20 2018 101 401.3, filed on Mar. 13, 2018 and International Patent Application No. PCT/EP2019/053846, filed on Feb. 15, 2019, the entire contents of which are incorporated herein by reference.

TECHNICAL FIELD

The invention relates to an electronic device, comprising a housing, which is filled to a predetermined fill level with a first matrix produced from a first potting compound, at least one circuit board arranged in the housing, and, arranged on the circuit board or on one of the circuit boards, as the case may be, at least one component, which has one or more passageways extending through it and which is embodied and arranged in the housing in such a manner that via the one or more passageways, a connection is provided between a component side arranged within a housing interior filled with the first matrix and a front face of the component arranged outside the housing interior filled with the first matrix.

BACKGROUND

Electronic devices of the above mentioned type comprise, among other things, measuring devices, which are applied in industrial measurements technology for measuring and/or monitoring metrologically registrable, measured variables.

There are a large number of applications, in which electronic devices are exposed to moisture at the location of use. Moreover, devices applied in explosion endangered regions must satisfy special safety requirements, which strive to prevent a spark formation, which, in given cases, can trigger an explosion in an explosion endangered region.

Thus, it is especially advantageous in the case of devices used in the aforementioned applications, both as regards explosion protection, as well as also as regards protecting their electronic circuits, in given cases, against moisture penetrating into the housing, that the first matrix fills the housing interior as completely as possible. This can be achieved e.g. by providing that the matrix is produced by means of a potting compound having a viscosity, which is as low as possible, so that the potting compound can penetrate into smallest hollow spaces and completely fill them.

The use of low viscosity potting compounds is, however, always problematic, when a component, which has at least one passageway extending through the component from a component side to a front face, is to be arranged in the housing in such a manner that only its front face protrudes out of the matrix. Such a component arrangement is desired e.g. in the case of components, such as e.g. plug connectors, plug contacts or female headers, in whose passageways there are arranged for electrical connection metal inserts, which have to be accessible from the outside via a front face protruding out of the matrix. In the case of such a component arrangement, the application of low viscosity potting compounds leads, however, to potting compound penetrating, especially due to capillary forces, into the regions of the passageways remote from the front face and hardening in the passageways. The leads in the case of the above examples of components to contact areas of the metal inserts provided in the passageways no longer being freely accessible from the outside, or no longer contactable from the outside, such that matching electrical connecting means, such as e.g. connector pins, can no longer be inserted into the component and/or connected to the component.

SUMMARY

It is an object of the invention to provide an electronic device of the above mentioned type, whose housing interior is essentially completely filled by the first matrix, without that the function of at least one component is degraded thereby.

For solution of such object, the invention resides in an electronic device comprising
  a housing, which is filled to a predetermined fill level with
    a first matrix produced from a first potting compound,
  at least one circuit board arranged in the housing, and,
  arranged on the circuit board or on one of the circuit boards, at least one component, which has one or more passageways extending through the component and which is embodied and arranged in the housing in such a manner that via the one or more passageways a connection is provided between a component side arranged within the housing interior filled with the first matrix and a front face of the component arranged outside the housing interior filled with the first matrix,
  whose one or more passageways are at least sectionally embodied in such a manner that they act as capillaries for media, whose viscosity is less than a predetermined limit value and as barriers for media, whose viscosity is greater than the limit value,
  characterized in that for the component, at least one of the components or each component, there is arranged in a spatially bounded region adjoining the component side of the component a second matrix produced from a second potting compound having a viscosity exceeding the limit value, which second matrix is embodied in such a manner that it effects a terminal sealing of the connection formed by the passageways of the component against the first potting compound used for producing the first matrix.

Devices of the invention offer the advantage that the second matrix effecting the sealing can be produced, without there resulting that the second potting compound used for its manufacture is drawn by capillary forces into the passageways. At the same time, the sealing offers the advantage that a low viscosity potting compound can be directly applied for the subsequent production of the first matrix filling out the housing interior, especially a low viscosity potting compound that is able also to fill smallest hollow spaces in the housing interior.

A first further development of the invention is characterized by features including that the second matrix, at least one of the second matrices or each second matrix is embodied as a second matrix produced from a second potting compound, which has a viscosity of greater than or equal to 20000 mPas and/or a viscosity from 20000 mPas to 30000 mPas.

A second further development is characterized by features including that the second matrix, at least one of the second matrices or each second matrix is embodied as a matrix produced from a second potting compound, which in contact with air forms after few minutes and/or after 2 minutes to 5 minutes a skin counteracting further flow of the second potting compound.

A third further development is characterized by features including that the second matrix, at least one of the second matrices or each second matrix is embodied as a silicone matrix produced from a one- or multicomponent, second potting compound.

A fourth further development is characterized by features including that the first matrix is embodied as a matrix produced from a first potting compound, whose viscosity is less than the limit value, less than or equal to 1100 mPas and/or in a range from 900 mPas to 1100 mPas.

A fifth further development is characterized by features including that the first matrix is embodied as a matrix produced from a first potting compound curing over a time period of a plurality of hours or more than one day.

A sixth further development is characterized by features including that the first matrix is embodied as a silicone matrix produced from a one- or multicomponent, first potting compound.

A seventh further development is characterized by features including that the circuit board or at least one of the circuit boards has a circuit board plane extending essentially perpendicularly to an upper surface of the first matrix, on such circuit board, at least one component is arranged, whose passageways essentially extend in parallel with the circuit board essentially on a straight line through the component, and the second matrix adjoining such component extends in such a manner over the component side formed by the rear face of the component opposite the front face of the component outside the first matrix that the second matrix forms a terminal sealing of the passageways.

An embodiment is characterized by features including that the component, at least one of the components or each component comprises a plug, a plug connector and/or a female header. Furthermore, the invention resides in an apparatus for manufacturing an electronic device of the invention, characterized in that the apparatus includes a holder, into which one or more circuit boards of the device can be inserted in such a manner that a surface normal to a first side of the circuit board, on which the component or at least one of the components is arranged, is inclined by an angle of inclination of less than 90° relative to a vertical axis extending opposite to gravitational force direction.

A first further development of the apparatus is characterized by features including that a circuit board is orientable in the holder in such a manner that a predetermined amount of the second potting compound is appliable in such a manner on the circuit board and/or the component side of the component that under the influence of gravity it achieves a form terminally sealing the one or more passageways.

A second further development of the apparatus is characterized by features including that the device includes a dosing system or, mounted in a transport apparatus, a dosing system, by means of which the second potting compound is appliable manually or in a fully- or partially automated procedure along at least one application line on the circuit board arranged in the holder and/or on the component side of the component arranged on the circuit board.

A third further development of the apparatus is characterized by features including that the angle of inclination a has a size from 15° to 40° and/or is in the order of magnitude of 30°.

BRIEF DESCRIPTION OF THE DRAWINGS

The invention and other advantages will now be explained in greater detail based on the figures of the drawing, in which an example of an embodiment is shown; equal elements are provided in the figures with equal reference characters. In order to be able to show elements of very different structural size, depictions are not always to scale. The figures of the drawing show as follows.

DETAILED DESCRIPTION

Figure 1:
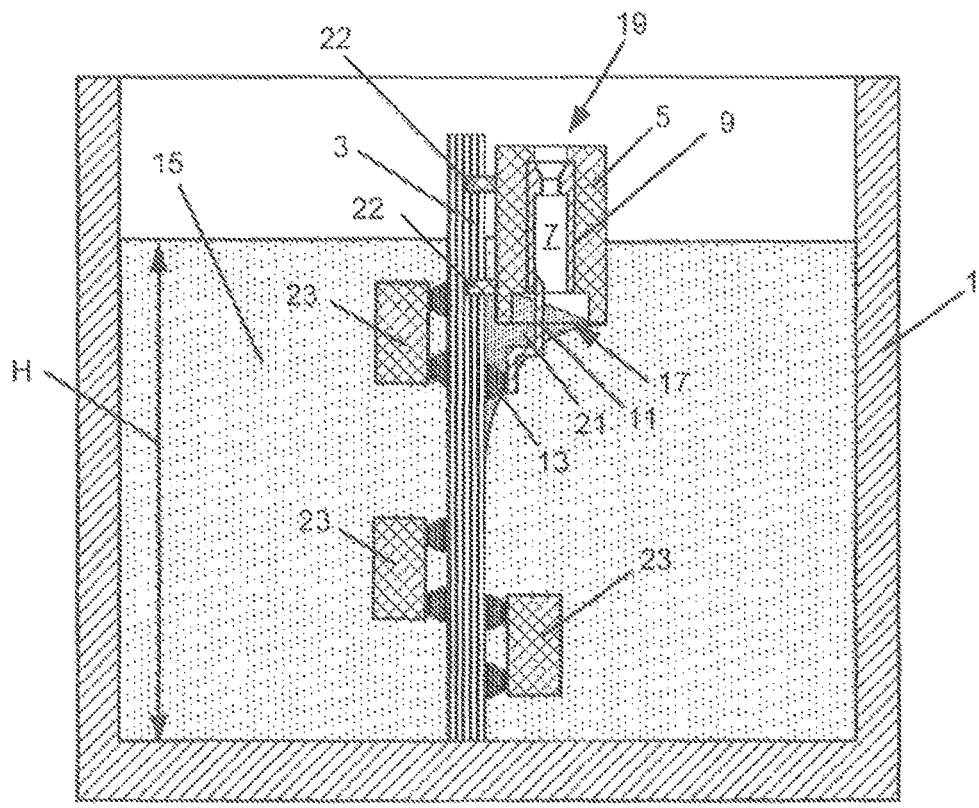
FIG. 1 shows an example of an electronic device.

FIG. 1 shows a schematic view of an electronic device, which comprises a housing 1 and at least one circuit board 3 arranged in the housing 1. Additionally, the device includes, arranged on the circuit board 3 or on one of the circuit boards 3, at least one component 5, which has at least one passageway 7 extending through it. Each of the components 5 can be embodied e.g. as a component of an electronic circuit arranged in the housing 1.

Although the invention is described here using the example of a device having a single circuit board 3 arranged in the housing 1 and a single component 5 arranged on the circuit board 3 and having passageways 7, the explanations hold naturally analogously also for devices having two or more circuit boards 3 and/or two or more components 5 arranged on one or more of the circuit boards 3.

The passageways 7 of the component 5 are, in each case, at least sectionally embodied in such a manner that they act as capillaries for media, whose viscosity is less than a predetermined limit value, and as barriers for media, whose viscosity is greater than the limit value.

Figure 2:
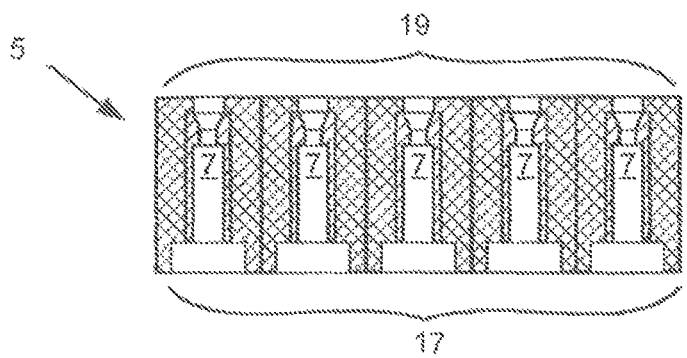
FIG. 2 shows a longitudinal section of the component of FIG. 1.
Figure 3:
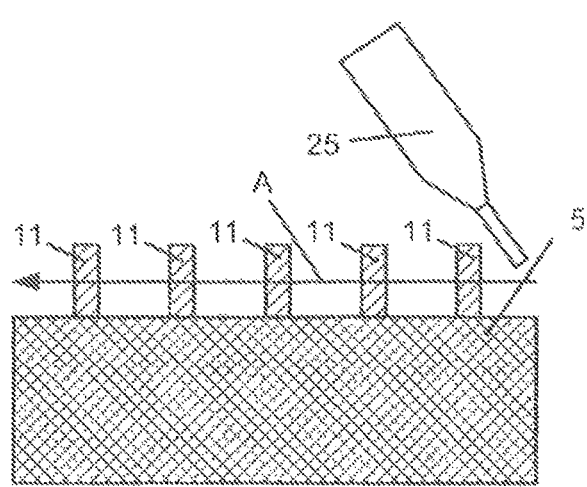
FIG. 3 shows a side view of the component of FIG. 1.

This is e.g. the case for conventional components 5 usually applied in the present state of the art for electrical connection of circuits or circuit components of electronic devices, i.e. components 5 such as e.g. plugs, plug connectors or female headers. FIG. 1 shows, as a possible example, a multi-pole, single row, female header, in FIG. 1 cross sectionally, in FIG. 2 in longitudinal section and in FIG. 3 in side view. This has a plurality of adjoining passageways 7 extending in the illustrated example straight through the component 5. Arranged in each passageway 7 is a metal insert 9 electrically contactable from the outside through a front end of the passageway 7. Metal insert 9 is connected via a component terminal 11 connected thereto via a solder joint 13 with a matching circuit board terminal arranged on the circuit board 3.

Housing 1 is filled to a predetermined fill level H with a first matrix 15 produced from a first potting compound. Additionally, the component 5 is embodied and arranged on the circuit board 3 in the housing 1 in such a manner that via the passageways 7 extending through the component 5, connections are made between a component side 17 arranged within the housing interior filled with the first matrix 15 and a front face 19 of the component 5 arranged outside the housing interior filled with the first matrix 15.

According to the invention, a second matrix 21 produced from a second potting compound having a viscosity exceeding the limit value is arranged in a spatially bounded region adjoining the component side 17. The second matrix 21 is embodied in such a manner that it effects a terminal sealing of the connections formed by the passageways 7 against the first potting compound used for producing the first matrix 15.

The second matrix 21 offers opposite alternatively insertable comparatively rigid covers the advantages that it clings very well to the surfaces of circuit board 3 and component 5 that it contacts and that it adjusts optimally to their forms.

That viscosity of the second potting compound exceeds the limit value offers the advantage that the second matrix 21 can be produced without the second potting compound being drawn by capillary forces into the passageways 7. Correspondingly, the ends of the passageways 7 facing the front face 19 of the component 5 are potting compound free. That offers the advantage that the functioning of the component 5 is not degraded by the second matrix 21. Especially, the inserts 9 can be electrically contacted from the outside through the front ends of the passageways 7.

Moreover, the sealing of the passageways 7 effected by the second matrix 21 prevents that the first potting compound applied subsequently for producing the first matrix 15 gets into the passageways 7. That offers the advantage that for producing the first matrix 15 a quite low viscosity, first potting compound can be applied, whose viscosity is actually less than the limit value. The latter is, due to its lower viscosity, able to penetrate also into very small hollow spaces in the housing interior and to fill these essentially completely. Correspondingly, the first matrix 15 produced from the low viscosity potting compound also fills very small subspaces of the housing interior essentially completely.

With reference to the desired essentially complete filling of the housing interior, the first matrix 15 is preferably embodied as a matrix produced from a first potting compound having a viscosity of less than or equal to 1100 mPas and/or a viscosity from 900 mPas to 1100 mPas.

Alternatively or supplementally, the first matrix 15 is preferably embodied as a matrix 15 produced from a comparatively slowly curing, first potting compound. This achieves that the first potting compound has comparatively ample time, in order also to flow into the smallest subspaces of the housing interior. For this, especially suited is a first potting compound, which cures over a time period of several hours, e.g. 24 hours, and even over a time period of more than one day.

Both as regards the viscosity as well as also as regards the curing time, suited is e.g. a silicone matrix produced from a correspondingly low viscosity, one- or multicomponent, potting compound, such as e.g. the two component silicone matrix sold by the firm, Wacker, under the product designation Silgel® 612.

The second matrix 15 is embodied as a second matrix 15 produced by means of the second potting compound preferably selected as a function of the dimensions of the passageways 7 determinative for the limit value. In connection with dimensions typical for passageways 7 of conventional components 5, such as e.g. plugs, plug connectors or female headers, suited for this is especially a second matrix 21 produced from a one- or multicomponent, second potting compound having a viscosity of greater than or equal to 20000 mPas and/or a viscosity from 20000 mPas to 30000 mPas.

Alternatively or supplementally, the second matrix 21 is preferably embodied as matrix produced from a comparatively rapidly curing potting compound. Suited for this is especially a second potting compound, which when in contact with air forms a skin after just a few minutes, e.g. after 2 minutes to 5 minutes, for counteracting further flow of the second potting compound. The skin is especially advantageous as regards the desired spatially limited forming of the second matrix 21 for effecting the sealing.

Both as regards the viscosity as well as also as regards the forming of the second matrix 21, suited is especially a silicone matrix produced from a one- or multicomponent potting compound, such as e.g. the single component silicone matrix sold by the firm Dow Corning under the product designation, SE9189.

Electronic devices of the invention, which comprise two or more components 5 embodied in the above described manner and arranged in the housing 1, comprise for at least one of these components 5, preferably for each of these components 5, in each case, a second matrix 21 terminally sealing the passageways 7 of the one or more components 5.

For manufacturing devices of the invention, one proceeds preferably in such a manner that the component 5 is arranged on a first side of the circuit board 3. This is done e.g. by mounting and/or soldering the component 5 on the circuit board 3. FIG. 1 shows for this an example, in the case of which the component 5 is plugged onto the circuit board 3. This is done with, arranged on the base facing the circuit board 3, orientation pins 22, which are inserted into complementary holes provided on the circuit board 3. Then, component terminals 11 are connected with matching circuit board terminals via soldered joints 13.

In the context of such method step, naturally also other, in given cases, required electronic components 23 to be located in the device within the housing interior filled with the first matrix 15 can be arranged, e.g. mounted and/or soldered, on the first side of the circuit board 3 and/or on a second side of the circuit board 3 opposite the first side. FIG. 1, by way of example, shows one electronic component 23 soldered on the first side and two on the second side of the circuit board 3. Then, the second matrix 21 is produced, in that the populated circuit board 3 is oriented and arranged inclined by an angle of inclination a in such a manner that subsequently an amount of the second potting compound predetermined as a function of the dimensions of the second matrix 21 to be produced can be deposited on the circuit board 3 and/or on the component side 17 in such a manner that under the influence of gravity it achieves a form terminally sealing the passageways 7 of the component 5.

Figure 4:
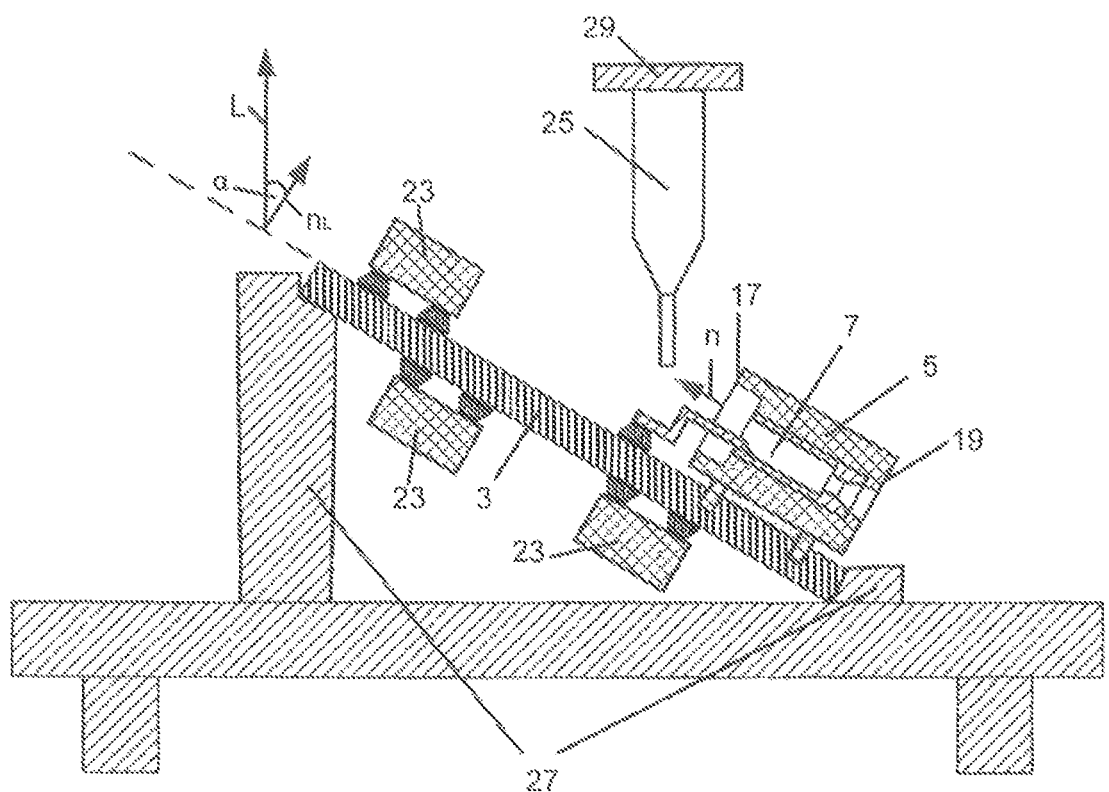
FIG. 4 shows an apparatus for manufacturing an electronic device.

For manufacturing devices of the invention, preferably an apparatus is applied, which includes a holder 27, into which the circuit board 3 is insertable with the above mentioned orientation in such a manner that a surface normal of the first side of the circuit board 3, where the component 5 is arranged, whose passageways 7 are to be terminally closed, is inclined relative to a vertical axis L extending opposite to gravitational force direction by an angle of inclination a of less than 90°. FIG. 4 shows an example of such an apparatus along with the populated circuit board 3 installed therein.

In such case, preferably an angle of inclination a is set predetermined as a function of the viscosity of the second potting compound. In connection with a second potting compound having a viscosity in the range from 20000 mPas to 30000 mPas, suitable for this is especially an angle of inclination a from 15° to 40° and/or in the order of magnitude of 30°.

Additionally, the holder 27 is embodied in such a manner that the circuit board 3 is orientable in the holder 27 in such a manner that the second potting compound in the above provided manner can be deposited in such a manner on the circuit board 3 and/or the component side 17 that it achieves under the influence of gravity a form terminally sealing the passageways 7 of the component 5.

That occurs in the case of the example illustrated in FIGS. 1 and 4, in that the circuit board 3 is oriented in such a manner that a surface normal n to the component side 17 formed here by the rear face of the component 5 opposite the front face 19 points upwardly and perpendicularly to the surface normal to the circuit board 3. Then, the second potting compound can be applied e.g. along an application line A indicated in FIG. 3 by the arrow.

The applying of the second potting compound can be performed manually e.g. by means of a dosing system 25 of the apparatus. Alternatively, the apparatus can include a dosing system 25 held in a transport apparatus 29 only schematically indicated in FIG. 4, by means of which dosing system 25 the second potting compound can be applied in a fully- or at least partially automated procedure along predetermined application lines A on circuit boards 3 and/or component sides 17 arranged in the holder 27 of components 5 arranged on circuit boards 3 arranged in the holder 27.

After applying the second potting compound, such cures to the second matrix 21. Then, the circuit board 3 is inserted into the housing 1 and the first potting compound filled into the housing 1, which then cures there to form the first matrix 15 shown in FIG. 1.

Devices of the invention can have various embodiments.

Thus, they can be embodied e.g. in the manner shown in FIG. 1, thus in such a manner that they comprise at least one circuit board 3, which is inserted in such a manner in the housing 1 that its circuit board plane extends essentially perpendicularly to an upper surface of the first matrix 15. Arranged on this circuit board 3 is at least one component 5, whose passageways 7 extend essentially in parallel with the circuit board 3 essentially linearly through the component 5. In the case of this form of embodiment, the second matrix 21 bordering on the component 5 extends in such a manner over the component side 17 formed here by the rear face of the component 5 opposite the front face 19 of the component 5 protruding out from the first matrix 15 that it forms a terminal sealing of the passageways 7.

The invention claimed is:

1. An electronic device, comprising
   a housing, which is filled to a predetermined fill level with a first matrix produced from a first potting compound,
   at least one circuit board arranged in the housing, and,
   arranged on the at least one circuit board, at least one component, which has one or more passageways extending through the at least one component and which is embodied and arranged in the housing in such a manner that via the one or more passageways a connection is provided between a component side arranged within the housing interior filled with the first matrix and a front face of the component arranged outside the housing interior filled with the first matrix,
   wherein a metal insert is arranged in the one or more passageways electrically contactable from the outside through a front end of the one or more passageways, the metal insert is connected via a component terminal connected thereto via a solder joint with a matching circuit board terminal arranged on the at least one circuit board,
   wherein the one or more passageways are at least sectionally embodied in such a manner that they act as capillaries for a first media, whose viscosity is less than a predetermined limit value, and as barriers for a second media, whose viscosity is greater than the predetermined limit value,
   wherein the at least one component, there is arranged in a spatially bounded region adjoining the component side of the at least one component a second matrix produced from a second potting compound having a viscosity exceeding the predetermined limit value, the second matrix is embodied in such a manner that it effects a terminal sealing of the connection formed by the one or more passageways of the at least one component against the first potting compound used for producing the first matrix.

2. The electronic device of claim 1, wherein the second matrix is embodied as a matrix produced from the second potting compound, which has a viscosity of greater than or equal to 20000 mPas or from 20000 mPas to 30000 mPas.

3. The electronic device of claim of claim 1, wherein the second matrix is embodied as a matrix produced from the second potting compound, which in contact with air forms after few minutes or after 2 minutes to 5 minutes a skin counteracting further flow of the second potting compound.

4. The electronic device of claim 1, wherein the second matrix is embodied as a silicone matrix produced from a one or multicomponent second potting compound.

5. The electronic device of claim 1, wherein that the first matrix is embodied as a matrix produced from the first potting compound, whose viscosity is less than the limit value, less than or equal to 1100 mPas or in a range from 900 mPas to 1100 mPas.

6. The electronic device of claim 1, wherein the first matrix is embodied as a matrix produced from the first potting compound curing over a time period of a plurality of hours or more than one day.

7. The electronic device of claim 1, wherein the first matrix is embodied as a silicone matrix produced from a one or multicomponent, first potting compound.

8. The electronic device of claim 1, wherein the at least one circuit board has a circuit board plane extending essentially perpendicularly to an upper surface of the first matrix,
   on the at least one circuit board, the at least one component is arranged, whose passageways extend essentially in parallel with the at least one circuit board on a straight line through the at least one component, and
   the second matrix adjoining the at least one component extends in such a manner over the component side formed by a rear face of the at least one component opposite to the front face of the at least one component outside the first matrix that the second matrix forms a terminal sealing of the passageways.

9. The electronic device as of claim 1, wherein the at least one component comprises a plug, a plug connector or a female header.

* * * * *